(12) United States Patent
Kanabar et al.

(10) Patent No.: US 9,274,150 B2
(45) Date of Patent: Mar. 1, 2016

(54) SYSTEMS FOR SYNCHROPHASOR DATA MANAGEMENT

(71) Applicant: General Electric Company, Schenectady, NY (US)

(72) Inventors: Mitalkumar Gulabrai Kanabar, Toronto (CA); Oscar Lopez Aguirre, Vizcaya (ES); Rodrigo Gutierrez Argandona, Vizcaya (ES); Jason Antonio Rodrigues, Toronto (CA); Mark Gerard Adamiak, Wayne, PA (US)

(73) Assignee: General Electric Company, Schenectady, NY (US)

( * ) Notice: Subject to any disclaimer, the term of this patent is extended or adjusted under 35 U.S.C. 154(b) by 476 days.

(21) Appl. No.: 13/709,050

(22) Filed: Dec. 9, 2012

(65) Prior Publication Data

US 2014/0164377 A1 Jun. 12, 2014

(51) Int. Cl.
*G06F 17/30* (2006.01)
*G01R 19/25* (2006.01)
*H04Q 9/00* (2006.01)

(52) U.S. Cl.
CPC .............. *G01R 19/2513* (2013.01); *H04Q 9/00* (2013.01)

(58) Field of Classification Search
CPC .................................................. F01R 19/2506
USPC ......................................................... 707/809
See application file for complete search history.

(56) References Cited

U.S. PATENT DOCUMENTS

| 4,074,354 | A  | * | 2/1978 | Nakagawa et al. ............... 714/3 |
| 6,259,173 | B1 |   | 7/2001 | Dias et al. |
| 2008/0075019 | A1 |   | 3/2008 | Petras |
| 2009/0088990 | A1 | * | 4/2009 | Schweitzer et al. ............ 702/58 |
| 2013/0235621 | A1 | * | 9/2013 | Yan et al. .................... 363/21.12 |

FOREIGN PATENT DOCUMENTS

| WO | 2010033839 A1 | 3/2010 |
| WO | 2012127058 A1 | 9/2012 |

OTHER PUBLICATIONS

IEEE Standard for Synchrophasors for Power Systems, IEEE 1344, 1995.
IEEE standard for Synchrophasors for Power Systems, IEEE C37.118-2005.
IEEE Draft Standard for Synchrophasor Measurements for Power Systems, IEEE C37.118.1, under construction in 2011.
(Continued)

*Primary Examiner* — Baoquoc To
(74) *Attorney, Agent, or Firm* — Parks Wood LLC

(57) ABSTRACT

A system includes a Synchrophasor Data Management System (SDMS), in which the SDMS includes a Synchrophasor Processor System (SPS). The SPS includes a Phasor Data Concentrator (PDC) configured to receive a first plurality of inputs from a first Phasor Measurement Unit (PMU), transform at least one of the first plurality of inputs into a first time aligned output by time aligning the at least one of the first plurality of inputs. The SPS further includes a virtual PMU configured to aggregate the first time aligned output into a PMU dataset, in which the SPS is configured to transmit the PMU dataset to a second PMU, an external PDC, a super PDC, or a combination thereof.

14 Claims, 5 Drawing Sheets

(56) References Cited

OTHER PUBLICATIONS

IEEE Draft Standard for Synchrophasors Data Transfer for Power Systems, IEEE C37.118.2, under construction in 2011.
IEC standard for Communication networks and systems for power utility automation—Part 90-5: Use of IEC 61850 to transmit synchrophasors information according to IEEE C37.118, IEC 61850-90-5, TR, under construction in 2011.
R. Shulz, L. S. Vanslyck, S. H. Horowitz, "Applications of fast phasor measurements on utility systems," in IEEE proc. of Power Industry Computer Application Conference, 1989.
Bharat Bhargava, "Synchronized phasor measurement system project at Southern California Edison Co.," IEEE 1999.
SEL-3373, online 2 pages, [Retrieved on Nov. 12, 2013], [Online] http://www.selinc.com/SEL-3373/.
EPG's e-sPDC, online 1 pages, [Retrieved on Nov. 13, 2013], [Online] http://www.electricpowergroup.com/solutions/epdc/index.html.
OpenPDC, "The Open Source Phasor Data Concentrator" online 7 pages, [Retrieved on Nov. 12, 2013], [Online] http://openpdc.codeplex.com/.
Kalkitech Sync 4000 PDC, online 1 page, [Retrieved on Nov. 13, 2013], [Online] http://www.kalkitech.com/offerings/sync-4100-series-phasor-data-concentrator.
NRC Alstom, online 3 pages, [Retrieved on Nov. 31, 2013], [Online] http://www.nrc.com.tw/ENG/elec/alstom_e.html.
European Search Report and Written Opinion issued in connection with corresponding EP Application No. 13196013.0-1804 on Apr. 29, 2014.
Martin, "Synchrophasor Standards Development—IEEE C37.118 & IEC 61850", Proceedings of the 44th Hawaii International Conference on System Sciences—2011, IEEE, pp. 1-8, Jan. 4, 2011.

* cited by examiner

SYSTEMS FOR SYNCHROPHASOR DATA MANAGEMENT

BACKGROUND

The subject matter disclosed herein relates to wide area monitoring of electrical grid infrastructure, and more specifically, to the management of synchrophasor data.

Generally, a system that monitors an electrical grid, such as a power grid, may use Phasor Measurement Units (PMUs) to measure electrical signals on the electrical grid. The PMUs may be able to measure parameters such as frequency, voltage, current, or power. Certain measurements, such as phasor data, may then be communicated to a Phasor Data Concentrator (PDC). A function of the PDC is to concentrate data from various PMUs, and to distribute the data. Accordingly, the PDC may be able to initiate communication with multiple PMUs, archive data for post event analysis, aggregate and re-transmit data, and filter/structure output datasets. The PDC may then output datasets to upstream devices such as other PDCs, a super PDC, or another device.

Power grid applications may be used to process the data transmitted by the PDC. For example, the PDC may output the datasets for analysis of power transmissions. The described communication between the PDCs, PMUs, and super PDCs may use the Institute of Electrical and Electronics Engineers (IEEE) protocols C37.118 and derivatives (i.e., C37.118X). A wide variety of systems may understand data transmitted by using C37.118X. It would be beneficial to improve the data management and communication of synchrophasor and related data.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system includes a Synchrophasor Data Management System (SDMS), in which the SDMS includes a Synchrophasor Processor System (SPS). The SPS includes a Phasor Data Concentrator (PDC) configured to receive a first plurality of inputs from a first Phasor Measurement Unit (PMU), transform at least one of the first plurality of inputs into a first time aligned output by time aligning the at least one of the first plurality of inputs. The SPS further includes a virtual PMU configured to aggregate the first time aligned output into a PMU dataset, in which the SPS is configured to transmit the PMU dataset to an external PDC, a super PDC, or a combination thereof.

In a second embodiment, a non-transitory computer readable medium comprising instructions configured to provide a Phasor Data Concentrator (PDC) functionality, in which the PDC functionality comprises receiving a first plurality of inputs from a first Phasor Measurement Unit (PMU), and transforming at least one of the first plurality of inputs into a first time aligned output by time aligning the at least one of the first plurality of inputs. The instructions further configured to provide a PMU functionality, in which the PMU functionality comprises aggregating the first time aligned output into a PMU dataset. The instructions further configured to transmit the PMU dataset to a second PMU, an external PDC, a super PDC, or a combination thereof.

In a third embodiment, a system including a processor. The processor includes a Phasor Data Concentrator (PDC) configured to receive a plurality of inputs from a first Phasor Measurement Unit (PMU), transform at least one of the plurality of inputs into a time aligned output by time aligning the at least one of the first plurality of inputs. The processor further including a virtual PMU configured to aggregate the time aligned output into a PMU dataset and a mapping system configured to map the plurality of inputs, the PMU dataset, or a combination thereof, into a first protocol, a second protocol, or a combination thereof, in which the processor is configured to transmit the PMU dataset in the first protocol, the second protocol, or a combination thereof.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
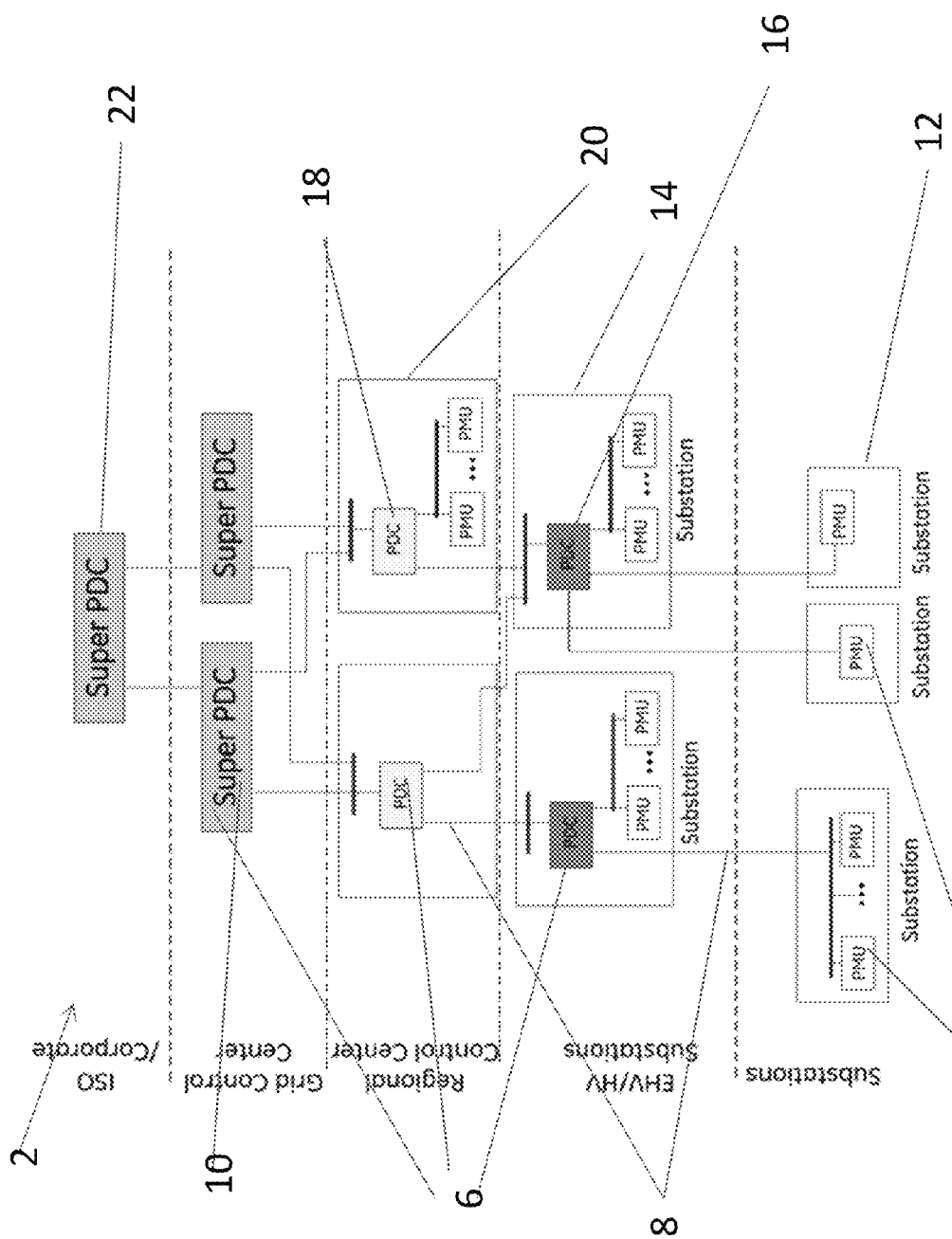
FIG. 1 is a schematic diagram of a of an embodiment of a tiered power grid monitoring system.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Certain systems, such as an electrical grid, may be monitored by Phasor Measurement Units (PMUs) geographically located at different points on the system. The measured values may be then transmitted to a Phasor Data Concentrators (PDC). The PDC may then concentrate the data for transmission to other systems. For example, the PDC may synchronize real-time sub-second phasor data streams for use by synchrophasor applications. The data streams (e.g., synchrophasor datasets), may then be communicated other PDCs, other PMUs, a super PDC, and/or a visualizer. With the adoption of Institute of Electrical and Electronics Engineers (IEEE) C37.118 and derivatives, i.e., IEEE C37.118X, the measurement latency has gone from seconds and minutes to milliseconds. Other protocols may also be used, such as the International Electrotechnical Commission (IEC) 61850-90-5 protocol.

Accordingly, the techniques described herein advantageously include a Synchrophasor Data Management System (SDMS), in which the SDMS additionally includes a Synchrophasor Processor System (SPS). The SPS may provide functionality equivalent to a Phasor Data Concentrator (PDC), but add functionality, such as including a virtual or pseudo-PMU. Indeed, the SPS may provide PDC functionality with additional functionality provided by a PMU, in a single device, such as a modular computing device enclosed in a chassis having a redundant power supply and a data bus. For example, the SPS may be included in a single board computer communicatively coupled to the data bus. The SDMS chassis may include other single board computers, which may also be attached to the data bus, such as a Historian system suitable for data storage and communication of archived data. The Historian system may be included in a second single board computer communicatively coupled to the data bus and disposed inside the chassis. Likewise, an Application system hosting a software platform providing for variety of synchrophasor applications, such as applications suitable for analyzing synchrophasor data, may be included in a third single board computer communicatively coupled to the data bus and disposed inside the chassis.

The SPS may receive data inputs in the IEEE C37.118X protocols, and/or the IEC 61850-90-5 protocol. The SPS may then use, for example, a protocol mapping system to map one or both protocols into an agnostic format or data structure. The internal processing of the incoming data may then be carried out in this agnostic format. The output may then be communicated to external systems in either of the two formats. By using the agnostic data processing, the SPS may be more easily updated to support new protocols. Data may be received in one protocol outputted in another protocol, or in the same protocol. Additionally, by using the virtual or pseudo-PMUs to insert data into datasets, data from the SDMS, including alerts and diagnostic data, may use PMU data communication techniques to communicate data additional to PMU data. Systems using PMU communication compatible protocols (e.g., IEEE C37.118X and/or IEC 61850-90-5) may then retrieve the data and extract the alerts and diagnostics. The described SDMS/upgraded PDC and the PMUs may be configured in a tiered monitoring system such as the one depicted in FIG. 1.

FIG. 1 is a schematic diagram of a tiered monitoring system 2. As depicted, a PMU 4 may take measurements of a system, such as an electrical power grid. The PMU 4 may be able to measure parameters such as frequency, voltage, current, and/or power. The PMUs 4 may then transmit the measurements as phasor data, to PDCs 6 through a network 8 such as a Local Area Network (LAN) or a Wide Area Network (WAN). As described above, after the PDC 6 receives the measurements from the PMUs, the PDC 6 may synchronize real-time sub-second phasor data streams for use by synchrophasor applications, time align the measurements, filter the measurements, and so on. The synchronization may include using an external clock, such as a Global Positioning System (GPS) clock or an atomic clock. The measurements may be time aligned in order to give context to the measurement. After the measurements are concentrated, the PDC may output a dataset to other devices such as other PDCs 6 or a super PDC 10.

As depicted, one PDC 6 may receive inputs from multiple PMUs 4 at the same rate or at varying data rates. With the ability to transmit measurements over the network 8, the PDCs 6 may be located in a different geographic location from the PMUs 4 that they receive measurements from. As in the illustrated embodiment, some substations 12 may include only PMUs 4. These PMUs 4 may then transmit their measurements to PDCs 6 located in other substations 14. A substation PDC 16 may be installed at a high voltage substation 14, which can also be connected to other surrounding substations including PMUs 4. The substation including the PDC 16 may have a hardened rugged design and be configured to handle between approximately 20-40, 30-60, 90-120 or more PMUs 4, which may communicate data at data rates of approximately 1-120 frames per second (fps), 50-250 fps, or more, and to have a latency of approximately 3-10, 0.05-0.5 milliseconds, or less. The substation PDCs 16 may then transmit datasets to a PDC 6 located in a regional control center 20. A regional PDC 18 may be installed at a regional control and operating center. The regional PDC 18 may be arranged to handle approximately between 50-500 PMUs 4, or more, to have a data rate of approximately 30-60 fps, and to have a latency of around 10-100 milliseconds. In addition, regional PDCs 18 may be used to perform state estimation, post event analysis, and region event monitoring. The regional PDCs 18 may then transmit datasets to centralized super PDCs 22. The super PDC 22 may be installed at a main grid control center. The super PDC 22 may handle approximately between 500 to a few thousand PMUs 4, may have a data rate of approximately 1-30 fps, 10-100 fps, or more, and to have a latency of approximately 100 milliseconds to 1 second. In addition, the super PDC 22 may be configured to enable visualization. A further description of the PDC 6 receiving measurements transmitted from PMUs 4, concentrating the measurements, and outputting datasets can be seen in FIG. 2.

Figure 2:
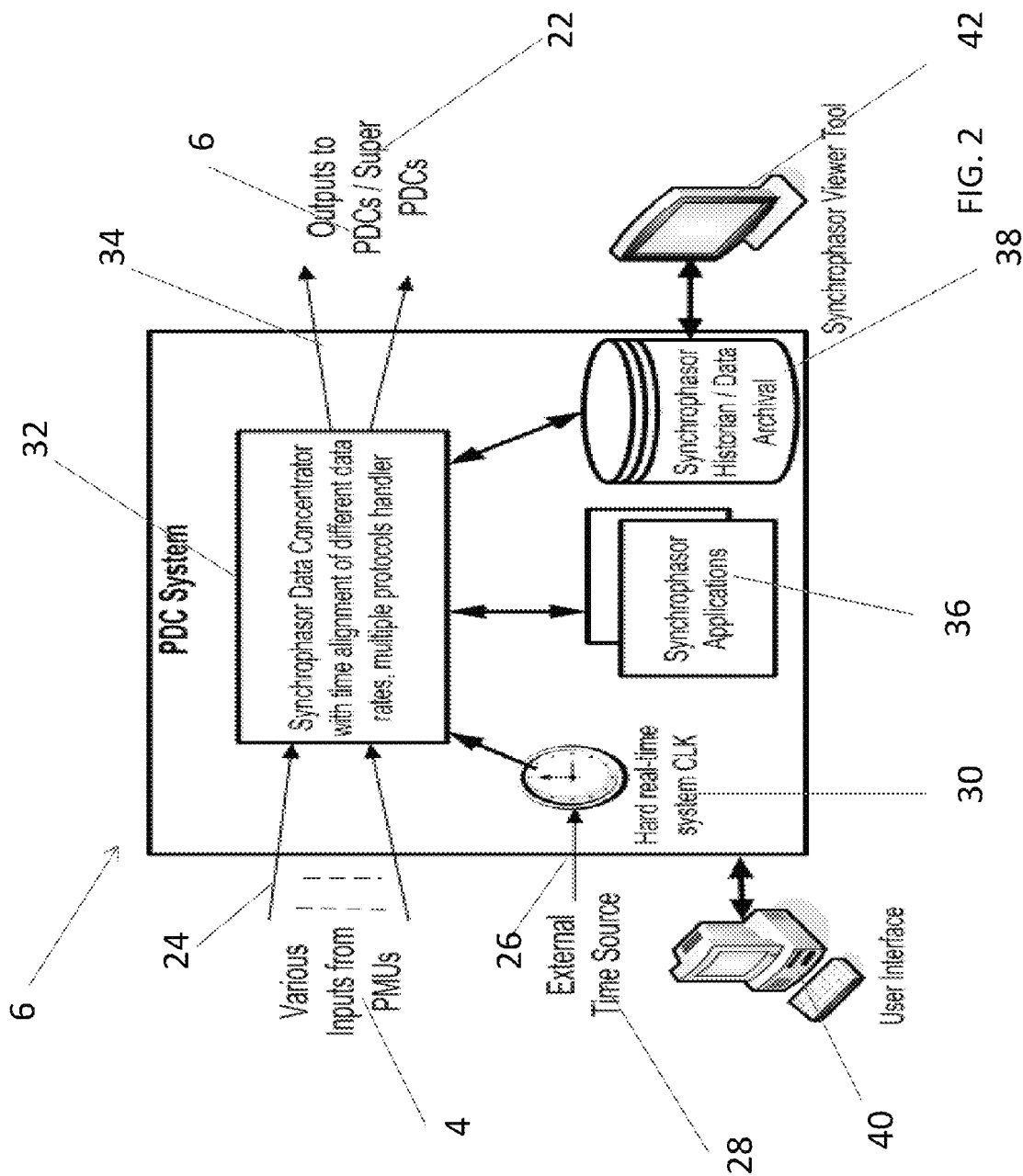
FIG. 2 is a schematic diagram of an embodiment of a synchrophasor data concentrator (PDC)

FIG. 2 is a schematic diagram of a PDC 6. The PDC 6 may configured to communicate with multiple PMUs 4, concentrate data, align data by time, identify missing data, archive the data for post event analysis, aggregate and re-transmit, and decimate and filter the output streams as required by the receiving application. As described above, the PDC 6 may receive measurements 24 from various PMUs 4. In addition, the PDC 6 may receive a time signal 26 form an external clock 28, such as a GPS clock, an atomic clock, and/or or a high resolution time clock. The time signal 26 may be used to set an internal clock 30. The PDC 6 may then be configured to concentrate and/or time align (process block 32) the measurements 24 based on the internal clock 30. The concentrated and/or time aligned measurements may then be outputted 34 to other devices such as other PDCs (e.g. 16 and 18) and/or super PDCs 22.

The PDC 6 may be further be configured to perform other tasks such as manipulating/extracting information from the measurements and archiving the measurements. In the depicted embodiment, the PDC 6 includes synchrophasor applications 36. These synchrophasor applications 36 may include phasor applications, such as state estimation, and event monitoring. In addition, the depicted PDC 6 includes a synchrophasor historian 38 which may be configured to archive the measurements for post event analysis.

The PDC 6 may also include human-machine interfaces (HMIs). As in the depicted embodiment, these may include a user interface 40 and a synchrophasor visualization or view tool 42. These HMIs may be included in the EnerVista Software Suite available from General Electric Co., of Schenectady, N.Y. For example, the synchrophasor view tool 42 may be EnerVista Synchrophasor Viewer and the user interface 40 may be EnerVista P30 Setup. As will be appreciated, the present techniques may provide for the PDC 6 functionality and add additional features that may be seen in FIG. 3.

Figure 3:
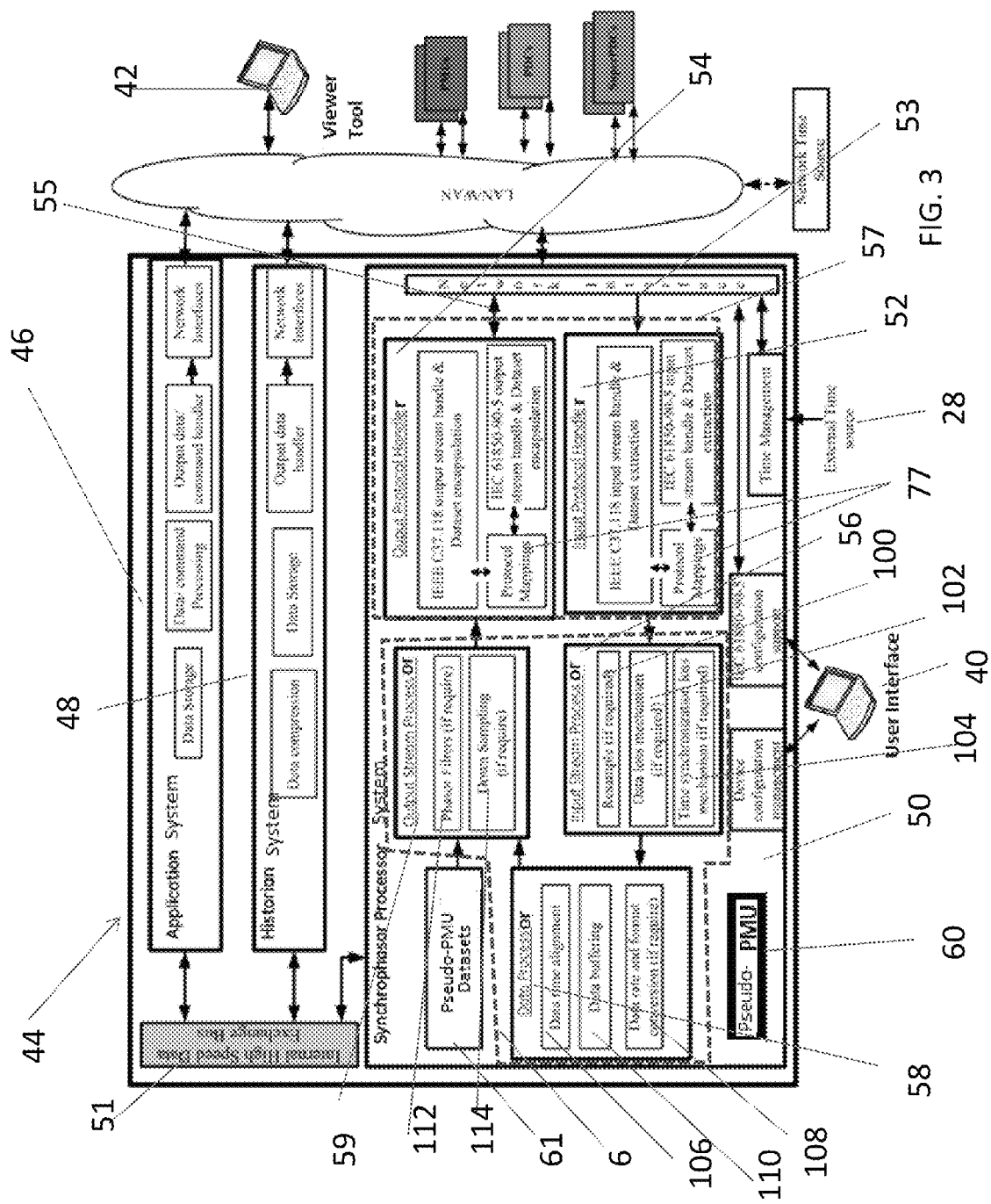
FIG. 3 is an information flow diagram of an embodiment of a synchrophasor data management system (SDMS), showing an Application System, a Historian System, a Synchrophasor Processor System, and protocol data mappings.

FIG. 3 is an information flow diagram of one embodiment of a synchrophasor data management system (SDMS) 44, showing an Application System 46, a Historian System 48, a Synchrophasor Processor System (SPS) 50, and a protocol mapping system 57. As should be appreciated, the SDMS 44 described herein may include the features of the PDC 6 of FIG. 2 along with additional features. Accordingly, the depicted SDMS 44 includes the user interface 40, the view tool 42, and the external time source 28. In one embodiment, the SDMS 44 may be provided as a computing device having a chassis with a redundant power supply and one or more replaceable single board computers communicatively coupled, for example, by a data bus. In another embodiment, the single board computers, or equivalents (e.g., blades), may be hot swappable.

One additional feature of the SDMS 44 includes modularity. In other words, the Historian System 48 (similar to the described historian 38 of FIG. 2) and the Application Systems 46 (similar to the described synchrophasor applications 36 of FIG. 2) may each be included as software components or hardware components of the single board computers. For example, a first single board computer may include the SPS 50, a second single board computer may include the Historian System 48, and a third single board computer may include the Application Systems 46, and all three boards may be disposed in the same chassis and provided with redundant power. In other embodiments, the systems 46, 48, and 50 may be provided in a single processor, in multiple processor systems, in redundant processing systems, (e.g., fault tolerant computing systems), and the like.

The Application System 46 may be used as a platform for phasor applications, and the Historian System 48 may be used to store a plurality of measurement inputs and other data. The Application System 46 may be used to perform functions such as scientific mathematical expressions/equations, Substation State Estimation, Synchro-Control (synchrophasor-based feedback control), Wide Area Out-of-Step measurement, and/or Oscillation Detection. In addition, the Application System 46 may include an operating system such as, any real time operating systems (VxWorks by Wind River), or Windows® available from Microsoft Corporation of Redmond, Wash. This may expand platform functionality by providing for custom software development using a variety of .NET tools, compilers, third-party components, and the like. In other words, the SDMS's 44 existing infrastructure may be used to expand and customize the platform while maintaining reliability. Similarly, the processing block 32 of FIG. 2 may be implemented by the Synchrophasor Processor System (SPS) 50.

Each of the systems (e.g. 46, 48, and 50) may each be a single board computer. Comparatively, the present techniques enable faulty systems to be replaced because each feature is on its own board. In addition, the modularity of the SDMS 44 may facilitate upgrading in the field by adding systems, as well as improving reliability by employing redundant systems. Other systems may be included in the SDMS 44 such as a Data Store System configured to provide local data storage to support the Historian System 46, Redundant Power Supply Systems configured to provide high or low voltage with redundant power supplies, and an Input Power Board and Output Contacts System configured to provide an external interface with power connections and relays. Each of the systems may be communicatively coupled to a data bus, such as an Internal High Speed Data Exchange Bus 51.

The techniques described herein may process, receive inputs, and send outputs using multiple protocols, such as IEEE C37.118X and IEC 61850-90-5. With the adoption of different protocols, the SPS 50 may be configured to accept inputs with varying protocols and to output datasets with varying protocols. Additionally, internal processing may be done in an agnostic format. This may be facilitated by mapping multiple communication protocols into an agnostic data structure using the protocol mappings systems 57. For example, in the depicted embodiment, the SPS 50 includes an input protocol handler 52 configured to convert an input signal 53 protocol into the agnostic format. The agnostic format may then be used during internal processing by the SPS 50. The SPS 50 also includes an output protocol handler 54 configured to transmit an output signal 55 in different protocols. Accordingly, the agnostic format may be converted and transmitted. The output signal 55 may be stream of datasets understandable by upstream devices. As illustrated, the protocols may include IEEE C37.118X and IEC 61850-90-5, among others. By using the agnostic format, any number of new protocols may be added. A further description of mapping the protocols may be seen in FIG. 5.

After the input protocol handler 52 maps the input signal 53 to a format (e.g., agnostic format) usable by the SPS 50, the data is passed through an Input Stream Processor 56, a Data Processor 58, and an Output Stream Processor 59. The Input Stream Processor 56 may be configured to check if received data is valid. Thus, the Input Stream Processor 56 may, if necessary, resample the data (block 100), determine if data is lost (block 102), or determine if the time synchronization is lost (block 104). Data may need to be resampled (block 100) because even though the data measurements, phasors measurements, may be tagged with time stamps, they have been transmitted at different rates. For example, some may have used 60 fps while other may have used 30 fps. In addition, because PMUs 4 may be at different geographical locations, there may be multiple report rates and different time delays over the network. Thus, a wait-time may be set, after which data may be declared lost (block 102). Finally, if the time synchronization is lost, the data may not be sufficiently accurate, which may be detected, and in certain cases overcome by using internal clocks (block 104).

Next, the data is passed to the Data Processor 58 which may be configured to time align the data (block 106), to structure the data (i.e. combining) (block 108), and to buffer the data (block 110). In other words, the Data Processor 58 may be configured to concentrate and further process the data to provide a unified data rate for real-time applications. For example, the Data Processor 58 may receive a plurality of inputs from the PMUs 4 at different data rates. The Data Processor 58 may then transform each plurality of inputs into a time aligned output by time aligning (block 106) each plurality of inputs. In addition, the aligned data from multiple PMUs 4 may be combined into a single data stream (block 108). Finally, the data may be buffered, which may facilitate communicating data in sequence to upstream devices such as regional PDCs 18 or super PDCs 22 (block 110).

After the Data Processor 58, the data is passed to the Output Stream Processor 59. The Output Stream Processor 59 may be configured, if necessary, to phasor filter (block 112) or down sample the data (block 114). For example, in certain cases, decimation (block 112) may be used to filter and lessen aliasing of the modulated frequencies carried by the phasor magnitudes. In addition, the sample rate of the data may be lowered (block 114) based on the upstream devices. As depicted, the data finally passes through the output protocol handler 54, is converted to the protocol requested by an upstream device, and outputted as the output signal 55.

Additionally, the techniques described herein provide for a Virtual or pseudo-PMU 60 in the SPS 50. Generally, the pseudo-PMU 60 may be configured to insert data from the SDMS 44 into a dataset, which may be in a PMU dataset format. The data may be inserted into a packetized data format that is outputted by a PMU 4. In other words, the SDMS 44 may be able to send data upstream by packetizing the data into the output signal 55. In the depicted embodiment, the pseudo-PMU 60 transmits the pseudo-PMU dataset 61 to the Output Stream Processor 59 to be aggregated into the output signal 55. As described above, PDCs 6 may be configured to receive data, which may be in the PMU dataset format, from PMUs 4. Thus, the upstream devices (i.e. regional PDCs 18 and super PDCs 22) are able to process data received in the PMU dataset format, which enables the SDMS 44 to communicate information through the existing tiered structure shown in FIG. 1. For example, the pseudo-PMU 60 may be configured to aggregate a time aligned output into the pseudo-PMU dataset 61, in which the SPS 50 is configured to transmit the pseudo-PMU dataset 61 to a second PMU 4, an external PDC 18, a super PDC 22, or a combination thereof. Advantageously, by using the pseudo-PMU 60, the SPS 44 containing PDC 18 functionality may enable the notification of issues and alerts such as failure of a PMU communication port, missing message limit exceeded, average communication latency exceeded, failure of authentication, or data rate output range. Diagnostic information such as average and variance of communication, input and output data rate in kbps, or the missing message rate may also be transmitted. Before using the techniques described herein, the alerts and diagnostics data may not have been provided by using PMU datasets in a format compatible with a variety of devices. Any SDMS data may now be transmitted with the PMU datasets, as described herein. A further description of the usage of the pseudo-PMU 60 may be seen in FIG. 4.

As described above, the SDMS 44 may include PDC 6 functionality in the Input Stream Processor 56, the Data Processor 58, and the Output Stream Processor 59. Thus, the SDMS 44 may be viewed as a PDC 6 with the additional features (e.g., pseudo-PMU 60) described herein. In addition, it should be appreciated that the techniques herein may be adapted to a kit that enables the additional features to be added to an existing PDC 6, for example, by flash upgrading memory, reprogramming processors, and the like.

It should be appreciated, that each of the systems 44, 46, 48, and/or 50 described may be implemented by using computer instructions stored in a non-transitory machine-readable medium, such as the memory of a computer, server, laptop, tablet, cell phone, mobile device, or similar processing or computing device. The computer instructions may be configured to be executed by a processor. Specifically, each of the systems described may be implemented in software.

Figure 4:
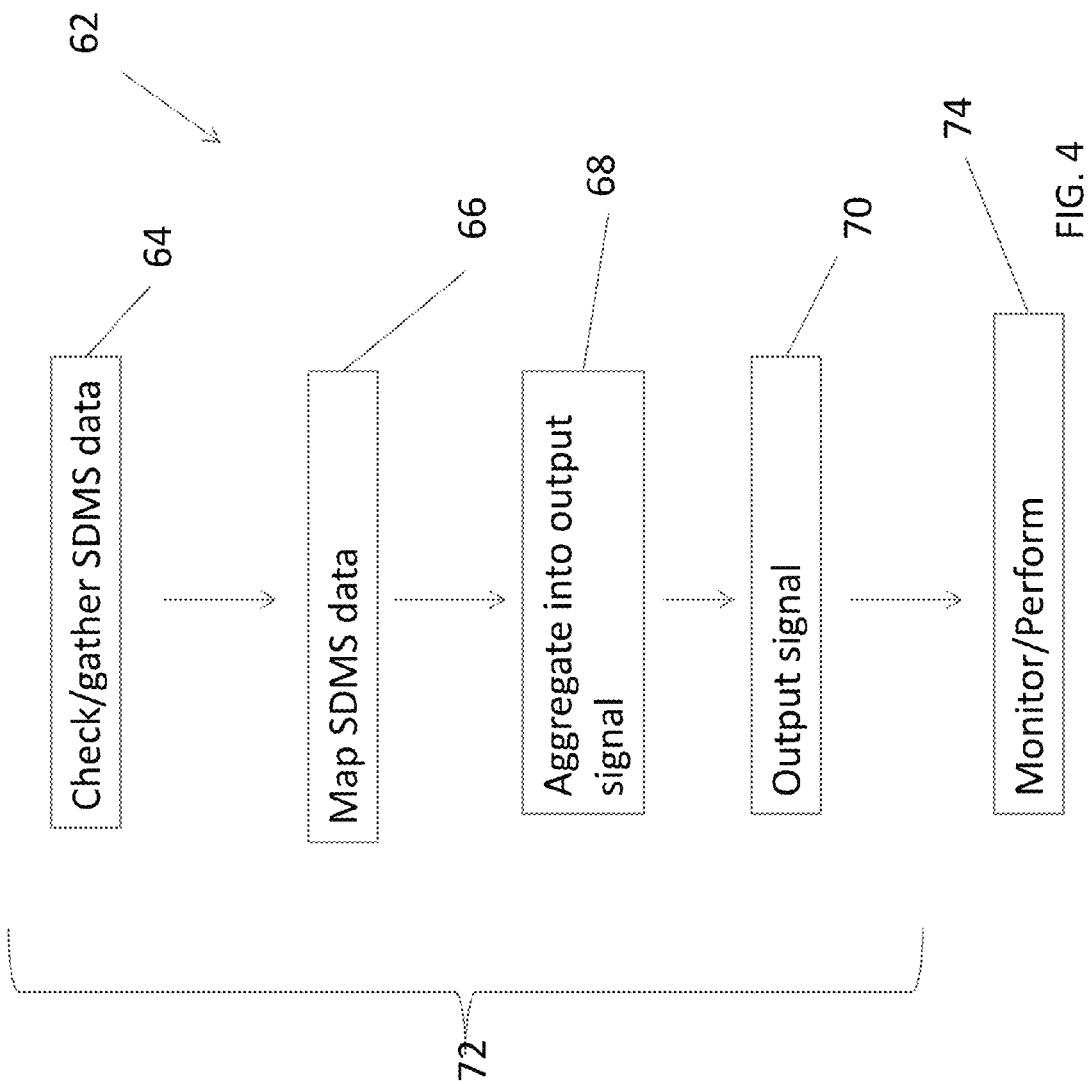
FIG. 4 is a flowchart of one embodiment of a pseudo-PMU of the synchrophasor data management system (SDMS) of FIG. 3.

FIG. 4 is a flow chart of one embodiment of a process 62 suitable for using, for example, the pseudo-PMU 60 of the synchrophasor data management system (SDMS) 44 of FIG. 3. As described above, the pseudo-PMU 60 may be used to communicate information from the SDMS 44 to devices upstream, acting as an in-band system. Thus, the communication process 62 may begin by checking/gathering the data that is desired to transmitted (block 64). For example, this may be checking for the presence of an issue such as average communication latency exceeded, or this could be gathering information such as a PMU latency rate. After the status is checked or information is gathered, it may be mapped into the PMU dataset format to generate the pseudo-PMU dataset 61 (block 66). This may include mapping the data gathered into a defined field of the PMU dataset format. For example, this may be an IEEE C37.118 dataset with no phasors (i.e., only analog and digital data fields) or an equivalent protocol. Next, the Virtual PMU dataset 59 may be aggregated into the output signal 55 of the SDMS 44 (block 68). As described above in FIG. 3, this may be done in the Output Stream Processor 59 because the data will already be in a format (i.e. PMU dataset format) useable by the Output Stream Processor 59. The output signal 55 will then be outputted from the SDMS 44 and transmitted to upstream devices (block 70). Because the Virtual data set 59 is in a format understandable by the upstream devices as well as the Output Stream Processor 59, the Output Stream Processor 59 and the Output Protocol Handler 54 may perform as normal. In the described embodiment, bracket 72 may be performed within the SPS 50. Finally, when the upstream device receives the output signal 55, it may either continue monitoring the status or perform ameliorative actions (block 74).

In the presently described embodiment, process 62 may be executed by the SPS 50. However, it should be appreciated, that each may step may be implemented by using computer instructions stored in a non-transitory machine-readable medium, such as the memory of a computer, server, laptop, tablet, cell phone, mobile device, or similar processing or computing device. The computer instructions may be configured to be executed by a processor. In addition, it should also be appreciated that the Output Protocol Handler 54 may convert the pseudo-PMU dataset 60 into the appropriate protocol for the upstream device. The protocol conversion for the output signals 55 may be seen in FIG. 5.

Figure 5:
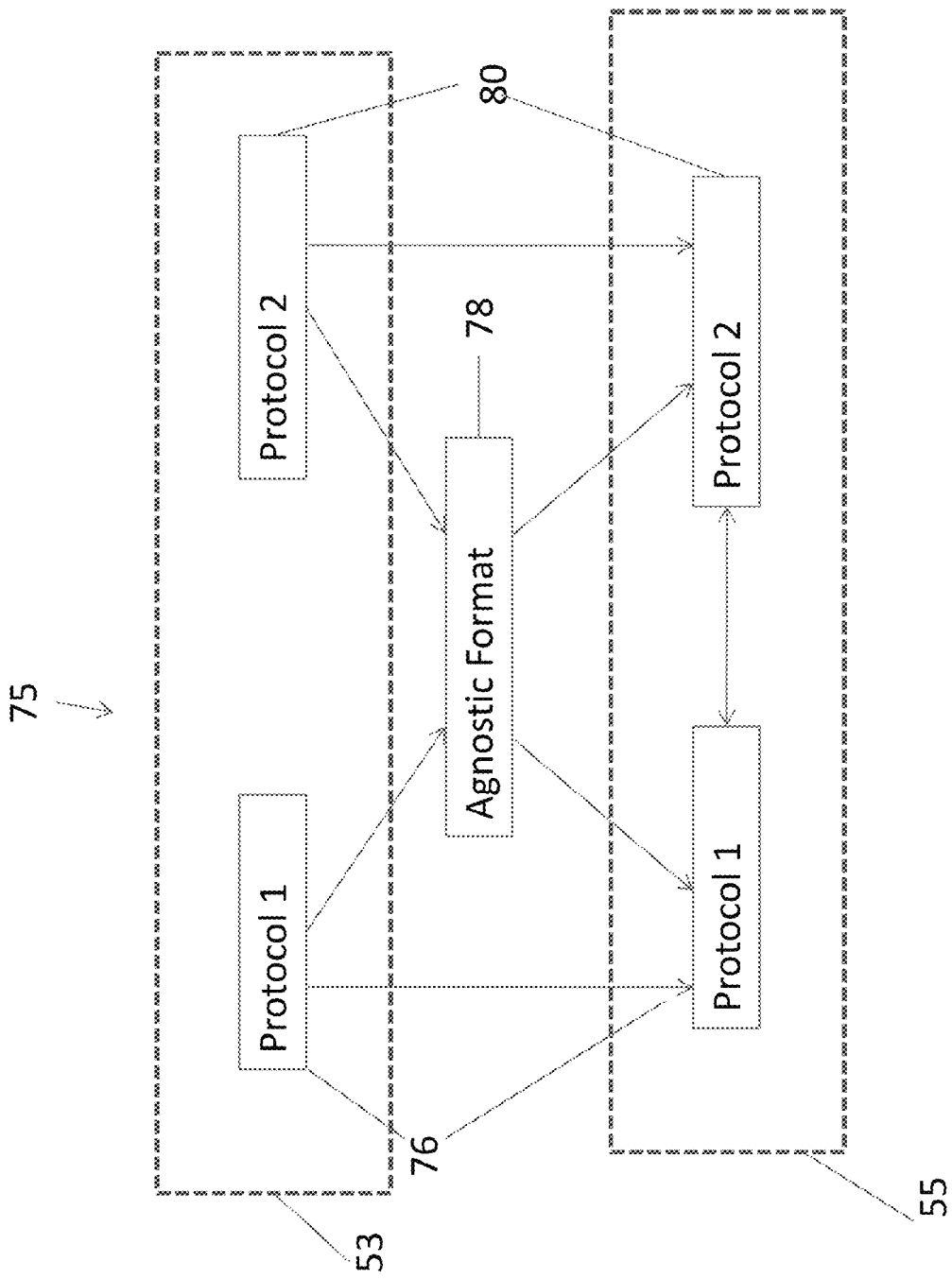
FIG. 5 is a data flow of one embodiment of mapping protocols in the synchrophasor data management system (SDMS) of FIG. 3.

FIG. 5 is a diagram of one embodiment of a data flow 75 showing the protocol mapping system 57 in the synchrophasor data management system (SDMS) 44 of FIG. 3. As described above, the SDMS 44 and more specifically the SPS 50 may be configured to accept inputs with varying protocols and to output datasets with varying protocols, which may be accomplished through mapping between multiple communication protocols, for example, to the agnostic data format. The present techniques enable the SDMS 44 to operate in multiple protocols. For example, the SDMS 44 may accept an input signal 53 (represented by the dashed box) in a first protocol. The Input Protocol Handler 52 in the SDMS 44 may then use the protocol mappings 77 to convert the input signal 53 into an agnostic format 78. It should be appreciated that, in another embodiment, the Input Protocol Handler 52 may leave the input signal 53 in the first protocol 76, which may be also usable by the SPS 50. The Input Protocol Handler 52 may convert the input signal 53 to the agnostic format 78 by using data constructs, such as C-struct, an object oriented class, memory map, or an equivalent. The agnostic format 78 may be configured to be usable by the SPS 50 during all facets of data processing. After the processing described in FIG. 3, if the input signal 53 is converted into the agnostic format 78, the Output Protocol Handler 54 may then either use the protocol mappings 77 to convert the signal back to the first protocol 76 or to a second protocol 80 before output, so that the signal 55 may be output in the first protocol 76, in the second protocol 80, or a combination thereof. Similarly, if the input signal 53 is received in the second protocol 80, the SPS 50 may make similar conversions to the agnostic format 78 for processing, or in another embodiment, use the second protocol 80 during processing. In addition, if the Input Protocol Handler 52 keeps the input signal 53 in the protocol received, the Output Protocol Handler 54 may output the output signal 55 in the first protocol 76 or convert the output signal 55 to the second protocol 80. The described protocol mapping system 57 may be used to convert between the IEEE C37.118X and IEC 61850-90-5. It should be appreciated the protocol mapping system 57 may be expanded to 3 or more protocols.

In the presently described embodiment, the protocol mapping system 57 may be implemented through hardware, software, or a combination thereof. However, it should be appreciated, that the mappings may be implemented by using computer instructions stored in a non-transitory machine-readable medium, such as the memory of a computer, server, laptop, tablet, cell phone, mobile device, or similar processing or computing device. The computer instructions may be configured to be executed by a processor.

Technical effects of the disclosed embodiments include improving management of synchrophasor data gathered from monitoring a system such as an electrical grid. In particular, the PDC 6 in the monitoring system may be expanded to the SDMS 44 described herein. In other words, the SDMS 44 may improve reliability in the monitoring system by enabling faulty parts to be swapped out in the field and facilitating issues and/or information concerning the SDMS 44 to be transmitted upstream. A PDC 6 included in the SPS 50 may include a pseudo-PMU 60 and use datasets to include data additional to PMU data, such as alert and diagnostic data for the PDC 6, SPS 60, or combination thereof. In addition, the SDMS 44 may improve the functionality of the monitoring system by enabling features to be upgraded in the field and by enabling multiple protocols to be used.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system comprising:
a memory having instructions stored thereon;
a processor that, when executing the instructions, is configured to perform operations comprising:
receiving, by executing a Phasor Data Concentrator (PDC) module, a plurality of phasor measurement unit (PMU) signals;
converting, by executing an input protocol handler module, one of the PMU signals into a first data structure having an agnostic format, the one of the PMU signals having a first format;
converting, by executing an output protocol handler module, the first data structure into a synchrophasor-related signal having a second format;
converting, by executing a pseudo-PMU module, data associated with another one of the received PMU signals into predetermined fields of a second data structure formatted according to the second format; and
combining, by executing the pseudo-PMU module, the second data structure with the synchrophasor-related signal to create an output signal;
wherein the first format is a PMU communication protocol and the second format is a PDC communication protocol.

2. The system of claim 1, wherein the first format is IEEE C37.118X and the second format is IEC 61850-90-5.

3. The system of claim 1, wherein the system is implemented on a single circuit board in a computer system.

4. The system of claim 1, wherein the operations further comprise transmitting the output signal to a device selected from the group consisting of another PDC and another PMU.

5. The system of claim 4, wherein the first format is a signal format associated with IEEE C37-118X and the second format is a signal format associated with IEC 61850-90-5.

6. The system of claim 1, wherein the receiving includes receiving PMU signals having different data rates.

7. The system of claim 1, wherein the data associated with the other one of the received PMU signal include alert data, diagnostic data, or a combination thereof.

8. The system of claim 1, further comprising one of (i) an application system configured to process phasor data and (ii) a logging system configured to store data.

9. The system of claim 1, wherein the system is implemented on a plurality of circuit boards in a computer system.

10. The system of claim 9, further comprising a chassis having a redundant power supply and a data bus, and wherein the circuit boards are each communicatively coupled to the data bus.

11. The system of claim 1, wherein the second data structure includes no phasor data.

12. A non-transitory computer-readable medium comprising instructions that, when executed by a processor, cause the processor to perform operations comprising:
receiving a plurality of phasor measurement unit (PMU) signals;
converting one of the PMU signals into a first data structure having an agnostic format, the one of the PMU signals having a first format;
converting the first data structure into a synchrophasor-related signal having a second format; and
converting data associated with another one of the received PMU signals into predetermined fields of a second data structure formatted according to the second format; and
combining the second data structure with the synchrophasor-related signal to create an output signal;
wherein the first format is a PMU communication protocol and the second format is a PDC communication protocol.

13. The non-transitory computer-readable medium of claim 12, wherein the first format is a format associated with IEEE C37.118X the second format is a format associated with IEC 61850-90-5.

14. The computer-readable medium of claim 12, wherein the data associated with the other one of the received PMU signal includes alert data, diagnostic data, or a combination thereof.

* * * * *